(12) United States Patent
Graves

(10) Patent No.: US 6,414,533 B1
(45) Date of Patent: Jul. 2, 2002

(54) OVER-VOLTAGE TOLERANT, ACTIVE PULL-UP CLAMP CIRCUIT FOR A CMOS CROSSBAR SWITCH

(75) Inventor: Christopher Michael Graves, Sherman, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/447,929

(22) Filed: Nov. 23, 1999

(51) Int. Cl.[7] ................................................ H03K 5/08
(52) U.S. Cl. ........................ 327/319; 327/318; 327/321
(58) Field of Search ................................. 327/309, 310, 327/313, 314, 318–321, 327, 328, 331

(56) References Cited

U.S. PATENT DOCUMENTS

| | | | | |
|---|---|---|---|---|
| 4,386,284 A | * | 5/1983 | Wacyk et al. ............... 327/313 |
| 4,890,012 A | * | 12/1989 | Stockinger ................. 327/427 |
| 4,975,603 A | * | 12/1990 | Wise et al. ................. 327/310 |
| 5,455,523 A | * | 10/1995 | Wallace et al. ............... 327/76 |
| 5,495,198 A | * | 2/1996 | Chen .......................... 327/309 |
| 5,534,811 A | * | 7/1996 | Gist et al. ................... 327/309 |
| 6,052,019 A | * | 4/2000 | Kwong ....................... 327/391 |
| 6,069,515 A | * | 5/2000 | Singh ......................... 327/309 |

* cited by examiner

Primary Examiner—Kenneth B. Wells
(74) Attorney, Agent, or Firm—Wade James Brady, III; Frederick J. Telecky, Jr.

(57) ABSTRACT

A CMOS bus switch (20) having undershoot protection circuitry (22) to help prevent data corruption when the switch is open and the buses (A,B) are isolated from one another. A bias generator (30) sets a voltage (Bias) referenced to ground which allows the active pull-up clamp to turn on when the bus voltage goes negative. This clamp attempts to counteract the undershoot voltage and limit the Vgd or Vgs of the N-channel pass transistor (MN1) and the Vbe of the parasitic NPN transistor. Since the active pull-up clamp circuit is also over-voltage tolerant, this invention will work equally well in high, low, and mixed voltage systems.

20 Claims, 1 Drawing Sheet

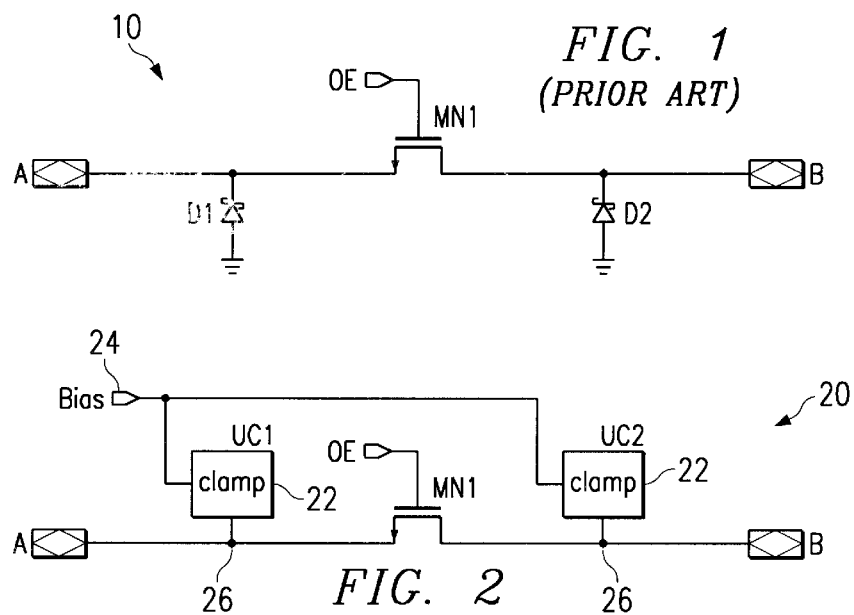
FIG. 1 (PRIOR ART)
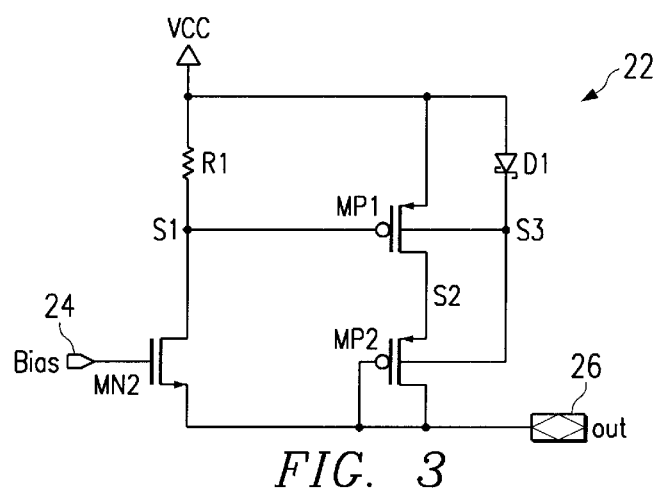
FIG. 2
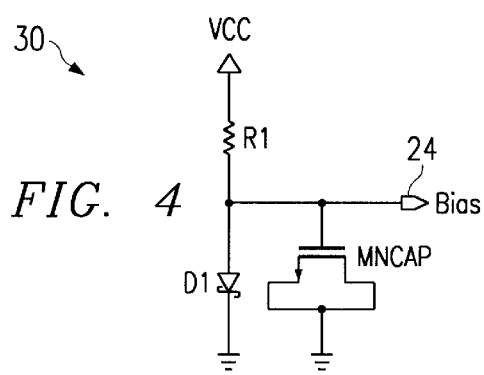
FIG. 3
FIG. 4

OVER-VOLTAGE TOLERANT, ACTIVE PULL-UP CLAMP CIRCUIT FOR A CMOS CROSSBAR SWITCH

FIELD OF THE INVENTION

The present invention relates generally to bus switches, and more particularly to CMOS bus switches.

BACKGROUND OF THE INVENTION

The digital electronics industry is migrating to lower operating voltages, but systems are performing at increasing speeds. High-speed bus switches are needed in these systems to keep the data moving fast. However, systems running at higher frequencies generate more noise and this could lead to corruption of data if not properly handled.

There is desired an improved high-speed bus switch that provides undershoot protection for the bus switch to ensure that the buses remain isolated when the switch is disabled. This would eliminate the need for special undershoot protection circuitry in the system design which results in a less expensive system.

A basic CMOS crossbar switch is shown in FIG. 1 as circuit 10. This circuit 10 is typical of the input/output configuration of a bus switch, which is an N-channel pass transistor MN1 with its source and drain connected to two different buses A and B. The gate of the pass transistor MN1 is controlled by an output enable (OE) signal generated from an output of an enable circuit. Thus, the switch MN1 will be closed when the gate voltage of transistor MN1 is high, and the switch MN1 will be open when the gate voltage of transistor MN1 is low. Also included in FIG. 1 are two Schottky diodes, D1 and D2, that are used for undershoot protection. In the enabled state (gate voltage of transistor MN1 is high), the undershoot voltage is not a problem. However, in the disabled state (gate voltage of transistor MN1 is low), a negative voltage on a bus could cause the N-channel pass transistor MN1 to turn on. This occurs when the negative bus voltage is larger in magnitude than the Vtn of transistor MN1. When one of the buses has a negative voltage that exceeds the forward turn-on voltage of the Schottky diode, then the diode will turn on and clamp the source or drain voltage of transistor MN1 in order to keep the buses isolated.

One major problem with this implementation is the fact that Schottky diodes are slow to react to undershoot voltages with fast edge rates. This could cause the N-channel pass transistor to turn on and allow a large amount of current to affect the isolated bus. The amount of current flowing from one bus to another will be significant because of an additional parasitic NPN transistor that is formed across transistor MN1. Since the base of the parasitic NPN is tied to the substrate and is at ground, the negative undershoot voltage will turn on the NPN transistor if not clamped below the threshold voltage. In addition, the large capacitance of the Schottky diodes needed for clamping an undershoot makes this alternative very undesirable in bus switch applications.

Another implementation to protect bus switches against undershoot voltages is that of a charge pump. A charge pump with a negative voltage output could be used to control the gate of the pass transistor and the substrate bias. This could keep both the N-channel pass transistor MN1 and the parasitic NPN off and keep the buses isolated. The problem with the charge pump solution is that the power supply current (Icc) is much higher, and the silicon area required on a die is greater due to the charge pump cells and the oscillator. Since bus switches are often found in systems where power consumption is critical, using a charge pump for undershoot voltage protection is not an effective solution.

SUMMARY OF THE INVENTION

A CMOS bus switch with undershoot protection to help prevent the corruption of data when the switch is open and the buses are isolated. The present invention includes an active pull-up clamp circuit one coupled to each bus. The clamp circuit does not use a charge-pump or Schottky diodes, and occupies reduced silicon wafer space.

BRIEF DESCRIPTION OF THE DRAWINGS

FIG. 1 is a schematic diagram of a prior art basic CMOS crossbar switch with Schottky diode clamps;

FIG. 2 is a schematic diagram of a CMOS crossbar switch with active pull-up clamp circuits according to the present invention;

FIG. 3 is a schematic diagram of the active pull-up clamp circuit shown in FIG. 2; and FIG. 4 is a schematic diagram of the Bias reference circuit shown in FIG. 2 and FIG. 3.

DETAILED DESCRIPTION OF THE PREFERRED EMBODIMENT

Clamp Circuit

A clamp circuit 20 according to the present invention that solves the undershoot voltage problem described previously is shown in FIG. 2. This clamp circuit 20 shows a basic crossbar switch MN1 with additional clamp circuitry UC1 and UC2 shown at 22, one connected to each of the I/0 ports A and B. The switch output enable signal, OE, is the same signal shown in FIG. 1 and controls the N-channel pass transistor MN1 gate bias. A schematic of the active pull-up clamp circuit 22 is shown in detail in FIG. 3 and is described below. A bias reference circuit 30 seen in FIG. 4 generates the bias signal "Bias" at node 24 that is shown in FIG. 2 to provide a bias control signal "Bias" to the clamp circuitry 22.

A detailed schematic of the active pull-up clamp circuit 22 is shown in FIG. 3. Under normal operation, this clamp circuit will be biased off and will not affect the bus switch MN1 other than the additional parasitic capacitance seen at the I/0 ports A and B. Since the bias signal Bias will be lower than the Vtn of MN2, any voltage level on the out node 24 that is at ground or higher will keep MN2 biased off. This allows resistor R1 to pull up node S1 to Vcc which keeps MOS transistor MP1 biased off and the data path from the I/0 port A or B to Vcc blocked. Schottky diode D1 is included in the active pullup clamp circuit 22 to block any leakage current from the substrate to Vcc.

The present invention derives technical advantages in circumstances that allow the clamp circuit 22 to become an active pull-up circuit, specifically, when there is an undershoot voltage on the I/0 port A or B. The bias reference signal Bias is designed to be approximately 0.3V above ground so that transistor MN2 will turn on sooner than if biased at ground. This is possible because the undershoot voltage doesn't need to be a full Vtn in magnitude, but rather, only Vtn−0.3V. When the negative undershoot becomes greater than Vtn−0.3V, transistor MN2 will turn on and pull down node S1 to the undershoot voltage. As transistor MN2 pulls node S1 low, transistor MP1 will turn on and pull up node S2 to Vcc. Since the gate of transistor MP2 is connected to the out node 26, transistor MP2 will also be biased on and attempt to pull-up the bus voltage. The active pull-up, comprised of the series combination of transistors MP1 and MP2, is not intended to pull up the bus voltage to Vcc, but to limit the severity of the undershoot voltage seen at the I/0 port A or B. The idea here is to limit the undershoot voltage magnitude to less than the threshold voltage of both the N-channel pass transistor MN1 and the parasitic NPN transistor that is associated with the pass transistor MN1.

The active pull-up clamp circuit 22 of the present invention achieves technical advantages by being designed to be over-voltage tolerant and Ioff compatible. The gate of transistor MP2 is tied to the out node 26 so a bus voltage higher than Vcc at node 26 will bias off MP2 and block the leakage current path back to Vcc. Also, in a power-down condition, a high bus voltage will keep MP2 turned off and the path to Vcc blocked. The other benefits of this clamp circuit are that its parasitic capacitance is much less than a Schottky diode clamp on the I/0 ports A and B and also that its power consumption is much less than that of a charge pump solution. In addition, the lower parasitic capacitance of the active pull-up clamp circuit 22 reduces the enable and disable propagation delays of the pass switch MN1. All of these benefits are critical in high-speed bus switches, especially in notebook applications.

One limitation with this implementation of clamp circuit 22 occurs when the undershoot has a great deal of energy for an extended period of time. The active pull-up clamp 22 will be less effective in this case when the undershoot overpowers the clamping action of the circuit. Another potential limitation is an oscillation in the active pull-up clamp circuit 22 from transistors MP1 and MP2 turning off and on. This problem is solved by adding a coupling capacitor, MNCAP, between the bias signal node 24 and ground as shown in FIG. 4. The capacitor helps to compensate for any ground noise that could turn MN2 on and off and cause an oscillation on the bus.

Bias Reference Circuit

The bias reference circuit 30 used to provide the Bias control signal for the crossbar switch 20 is shown in FIG. 4. The bias signal Bias is equal to a Schottky diode D1 forward voltage drop above ground or approximately 0.3V. A large resistor, R1, is included in the path between Vcc and ground to provide current to Schottky diode D1 and to minimize the DC power supply current drawn by this reference circuit 30. Another component that is incorporated in this circuit is an N-channel transistor, MNCAP, with its gate tied to the bias reference signal port 24 and its source and drain commonly connected to ground. This capacitor MNCAP couples the bias signal Bias to ground to help minimize the noise on the bias reference and prevent oscillations as previously described.

While the preferred embodiment has been described with reference to a CMOS-type crossbar switch, it is to be understood by one of skill in the art that the present invention finds advantages and uses in other crossbar switches as well including low-voltage crossbar switches.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

I claim:

1. A crossbar switch circuit for coupling an electrical signal over a bus between a first port and second port, comprising:

a first and second port and a bus having a first portion coupled to said first port and a second portion coupled to said second port;

a first switch serially coupled between said first portion of said bus and said second portion of said bus, said first switch having a control terminal for receiving a control signal to selectively electrically couple said first port to said second port via said bus;

a first active pull-up clamp circuit coupled to said bus and responsive to a negative undershoot voltage between said first port and said first switch to counteract said negative undershoot voltage on said bus between said first port and said first switch; and a second active pull-up clamp circuit coupled to said bus and responsive to a negative undershoot voltage between said second port and said first switch to counteract said negative undershoot voltage on said bus between said second port and said first switch.

2. The cross bar switch circuit of claim 1 wherein said active pull-up clamp circuit remains inactive when a voltage on the bus remains at ground or above.

3. The cross bar switch of claim 1 wherein said active pull-up clamp circuit comprises a second switch coupled between the bus and a positive voltage reference $V_{cc}$ for turning on only when there is a negative undershoot on the bus.

4. The cross bar switch circuit of claim 3 wherein said second switch has a control terminal connected to a bias voltage being greater than zero.

5. The cross bar switch circuit of claim 1 wherein said first switch comprises an N-channel MOS transistor.

6. The cross bar switch circuit of claim 1 further comprising a bias circuit providing said first switch control signal.

7. The cross bar switch circuit of claim 3 wherein said cross-bar switch is fabricated as an integrated circuit (IC) die having a substrate.

8. The cross bar switch circuit of claim 7 wherein said first and said second switches comprise MOS transistors.

9. The cross bar switch circuit of claim 8 wherein said first switch and said second switch each comprise of N-channel transistors.

10. The cross bar switch circuit of claim 9 further comprising a third switch and a fourth switch connected between $V_{cc}$ and the bus, said third and said fourth switches each comprising a P-channel transistor.

11. The cross bar switch circuit of claim 10 wherein said third switch has a gate coupled to $V_{cc}$ and said fourth switch has a gate coupled to the bus.

12. A crossbar switch circuit adapted to couple an electrical signal over a bus between a first port and second port, comprising:

a first switch coupled between said first port and said second port and having a control terminal adapted to receive a control signal to selectively electrically couple said first port to said second port; and a first active pull-up clamp circuit coupled to the bus adapted to counteract a negative undershoot voltage on the bus;

wherein said active pull-up clamp circuit comprises a second switch coupled between the bus and a positive voltage reference $V_{cc}$ adapted to turn on only when there is a negative undershoot on the bus;

said active pull-up clamp circuit further comprising a third switch and a fourth switch connected in series between the bus and $V_{cc}$ and being in parallel with said second switch.

13. The cross bar switch circuit of claim 12 wherein said third switch and said fourth switch each comprise a MOS transistor each having a gate, said third switch gate being coupled to the bus and the fourth switch being coupled to $V_{cc}$.

14. The cross bar switch circuit of claim 13 further comprising a resistor coupled between said second switch and $V_{cc}$, wherein said fourth switch gate is coupled between said second switch and said resistor.

15. The cross bar switch circuit of claim 13 wherein said second switch comprises an N-channel MOS transistor, and each said third and fourth switch comprise a P-channel MOS transistor.

16. The cross bar switch circuit of claim 13 wherein said cross bar switch is an integrated circuit die having a substrate, further comprising a Schottky diode connected between $V_{cc}$ and the substrate.

17. A crossbar switch circuit for coupling an electrical signal over a bus between a first port and second port, comprising:

a first port, a second port and a bus;

a first switch coupled between said first port and said second port and having a control terminal for receiving a first switch control signal to selectively electrically couple said first port to said second port via said bus; and a first active pull-up clamp circuit having a control terminal and coupled to the bus for counteracting a negative undershoot voltage on the bus;

a bias circuit providing a control signal to said control terminal of said first active pull-up clamp circuit for control of said first active pull-up clamp circuit;

said bias circuit comprising a capacitor coupled between said control terminal of said first active pull-up clamp circuit and ground.

18. The cross bar switch circuit of claim 17 wherein said capacitor comprises a N-channel transistor having a gate coupled to said second switch control and a drain and source each coupled to ground.

19. A crossbar switch circuit for coupling an electrical signal over a bus between a first port and second port, comprising:

a first port, a second port and a bus;

a first switch coupled between said first port and said second port and having a control terminal for receiving a first switch control signal to selectively electrically couple said first port to said second port via said bus; and a first active pull-up clamp circuit having a control terminal and coupled to the bus for counteracting a negative undershoot voltage on the bus;

a bias circuit providing a control signal to said control terminal of said first active pull-up clamp circuit for control of said first active pull-up clamp circuit;

said bias circuit comprising a capacitor coupled between said control terminal of said first active pull-up clamp circuit and ground;

said bias circuit further comprising a Schottky diode coupled in parallel with said capacitor.

20. The cross bar switch circuit of claim 19 further comprising a resistor coupled between said diode and $V_{cc}$.

* * * * *